(12) United States Patent
Yu et al.

(10) Patent No.: US 6,777,722 B1
(45) Date of Patent: Aug. 17, 2004

(54) METHOD AND STRUCTURE FOR DOUBLE DOSE GATE IN A JFET

(75) Inventors: Ho-Yuan Yu, Saratoga, CA (US); Valentino L. Liva, Los Altos, CA (US); Pete Pegler, Mesa, AZ (US)

(73) Assignee: Lovoltech, Inc., Santa Clara, CA (US)

( * ) Notice: Subject to any disclaimer, the term of this patent is extended or adjusted under 35 U.S.C. 154(b) by 0 days.

(21) Appl. No.: 10/191,030

(22) Filed: Jul. 2, 2002

(51) Int. Cl.[7] .............................................. H01L 29/74
(52) U.S. Cl. ...................... 257/134; 257/136; 257/217; 257/256; 257/268; 257/272; 257/283; 257/504
(58) Field of Search ............................... 257/134–136, 257/217, 256–287, 504

(56) References Cited

U.S. PATENT DOCUMENTS

| | | | |
|---|---|---|---|
| 3,381,188 A | 4/1968 | Zuleeg et al. ............... 317/235 |
| 4,404,575 A | 9/1983 | Nishizawa ................... 357/22 |
| 4,419,586 A | 12/1983 | Phipps ........................ 250/551 |
| 4,506,282 A | 3/1985 | Baliga .......................... 357/43 |
| 4,519,024 A | 5/1985 | Federico et al. ............ 363/127 |
| 4,523,111 A | 6/1985 | Baliga ......................... 307/574 |
| 4,645,957 A | 2/1987 | Baliga ......................... 307/570 |
| 4,700,461 A | 10/1987 | Choi et al. .................... 437/41 |
| 4,750,023 A | 6/1988 | Shannon ..................... 357/23.3 |
| 4,769,685 A | 9/1988 | MacIver et al. ............. 357/23.4 |
| 4,835,586 A * | 5/1989 | Cogan et al. ................ 257/260 |
| 4,845,051 A * | 7/1989 | Cogan et al. ................ 438/193 |
| 4,853,561 A | 8/1989 | Gravrok ...................... 307/443 |
| 5,038,266 A | 8/1991 | Callen et al. ................. 363/89 |
| 5,396,085 A | 3/1995 | Baliga .......................... 257/77 |
| 5,471,075 A * | 11/1995 | Shekar et al. ............... 257/139 |
| 5,488,236 A * | 1/1996 | Baliga et al. ............... 257/132 |
| 5,861,643 A * | 1/1999 | Chen et al. .................. 257/256 |
| 5,929,481 A * | 7/1999 | Hshieh et al. ............... 257/328 |
| 5,945,699 A | 8/1999 | Young ........................ 257/256 |
| 6,011,703 A | 1/2000 | Boylan et al. ................ 363/21 |
| 6,028,778 A | 2/2000 | Amano ........................ 363/40 |
| 6,064,580 A | 5/2000 | Watanabe et al. ............ 363/17 |
| 6,069,809 A | 5/2000 | Inoshita ....................... 363/98 |
| 6,084,792 A | 7/2000 | Chen et al. ................. 363/127 |
| 6,090,650 A | 7/2000 | Dabrai et al. ............... 438/195 |
| 6,104,172 A | 8/2000 | Josephs et al. ............. 323/222 |
| 6,180,519 B1 | 1/2001 | Kuroi et al. ................ 438/649 |
| 6,236,257 B1 | 5/2001 | Si et al. ...................... 327/379 |
| 6,251,716 B1 | 6/2001 | Yu ............................. 438/186 |
| 6,307,223 B1 | 10/2001 | Yu ............................. 257/256 |
| 6,404,157 B1 | 6/2002 | Simon ........................ 318/445 |
| 6,439,678 B1 | 8/2002 | Norton ......................... 347/9 |
| 6,566,201 B1 * | 5/2003 | Blanchard ................... 438/268 |

OTHER PUBLICATIONS

Kang et al.; "A New Type of Transistor: CBT"; IEEE Transactions on Electron Devices; vol. 40; #10; Oct. 93.

(List continued on next page.)

*Primary Examiner*—David Nelms
*Assistant Examiner*—Andy Huynh
(74) *Attorney, Agent, or Firm*—Wagner, Murabito & Hao LLP

(57) ABSTRACT

A method for fabricating a junction field effect transistor (JFET) with a double dose gate structure. A trench is etched in the surface of a semiconductor substrate, followed by a low dose implant to form a first gate region. An anneal may or may not be performed after the low dose implant. A gate definition spacer is then formed on the wall the trench to establish the lateral extent of a second, high dose implant gate region. After the second implant, the gate is annealed. The double dose gate structure produced by the superposition of two different and overlapping regions provides an additional degree of flexibility in determining the ultimate gate region doping profile. A further step comprises using the gate definition spacer to define the walls of a second etched trench that is used to remove a portion of the p-n junction, thereby further reducing the junction capacitance.

21 Claims, 18 Drawing Sheets

OTHER PUBLICATIONS

"N–Channel Enhancement–Mode MOSFET Transistors"; 2N6660JAN/JANTX/JANTXV; Product Summary; Siliconix; P–37515–Rev. A, Jul. 4, 1994.

General Semiconductor; GF2208; "N–Channel Enhancement–Mode MOSFET"; Jul. 10, 2001.

International Rectifier; IRF1205; HEXFET Power MOSFET; Nov. 3, 1999.

"N–Channel 30V–0.034Ω–22A D2PAK Stripfet Power MOSFET"; STB22NE03L: Preliminary Data; 6 pgs.; Nov. 2000.

"N–Channel Enhancement–Mode MOSFET Transistors"; 2N6601/VN88AFD; Product Summary; Siliconix; P–37655–Rev. B, Jul. 25, 1994.

Central Semiconductor Corp.; CMPF4391, CMPF4392 CMPF4393, N–Channel JFET; Product Summary.

Fairchild Semiconductor Corporation; "N–Channel/Logic Level Enhancement Mode Field Effect Transistor"; FDP6030L/FDB6030L; Apr. 1998.

Philips Semiconductors; "POWERMOS Transistor"; BUK463–60A/B; Product Specification; Jul. 1995.

* cited by examiner

METHOD AND STRUCTURE FOR DOUBLE DOSE GATE IN A JFET

FIELD OF THE INVENTION

Embodiments of the present invention relate to the field of junction field effect transistors (JFETs). More particularly, embodiments of the present invention relate to a reduction in the input capacitance of JFETs.

BACKGROUND ART

Junction field effect transistors (JFETs) are majority carrier devices that conduct current through a channel that is controlled by the application of a voltage to a p-n junction. JFETs may be constructed as p-channel or n-channel and may be operated as enhancement mode devices or depletion mode devices.

The most common JFET type is the depletion mode type. The depletion mode device is a normally "on" device that is turned off by reverse biasing the p-n junction so that pinch-off occurs in the conduction channel. P-channel depletion mode devices are turned off by the application of a positive voltage between the gate and source (positive $V_{gs}$), whereas n-channel depletion mode devices are turned off by the application of a negative voltage between the gate and source (negative $V_{gs}$). Since the junction of a depletion mode JFET is reverse biased in normal operation, the input voltage can be relatively high. Devices are available with input voltages with a magnitude greater than 100 volts.

Enhancement mode, or normally "off" JFETs are characterized by a channel that is sufficiently narrow such that a depletion region at zero applied voltage extends across the entire width of the channel. Application of a forward bias reduces the width of the depletion region in the channel, thereby creating a conduction path in the channel. P-channel enhancement mode JFETs are turned on by the application of a negative $V_{gs}$, and n-channel enhancement mode JFETs are turned on by the application of a positive $V_{gs}$. The input voltage of an enhancement mode JFET is limited by the forward breakdown voltage of the p-n junction.

The capacitance of a gate structure and its variation with voltage is related to the doping profile of the gate structure. Control over the doping profile can lessen the voltage dependence of the interelectrode capacitance and improve the output characteristics for analog applications such as amplifiers. The doping of the gate region of a JFET by ion implant has traditionally allowed for a degree of control over the doping profile in the direction normal to the substrate surface by varying acceleration potential applied to the ions being implanted. However, the prior art has not provided an equivalent degree of control over the lateral dopant distribution.

Historically, JFETs have been used for analog switches, radio frequency devices, current regulators and high input impedance amplifiers, while logic circuits such as microprocessors have been the domain of metal oxide semiconductor field effect transistors (MOSFETs) as exemplified by complementary metal oxide semiconductor (CMOS) technology.

Traditionally, JFETs have been used as discrete devices or as input stages on integrated circuits such as operational amplifiers. However, as circuit complexity, operating frequency, and power management requirements have increased for CMOS devices such as microprocessors, it has become desirable to integrate power management and conditioning functions on the same die with the logic. JFETs are candidates for performing these functions A transistor structure that is integrated on a logic circuit for the purpose of power management and conditioning will be faced with a requirement for high frequency operation and low power consumption. For field effect transistors (FETs), parasitic capacitances between the gate and source ($C_{gs}$) and gate and drain ($C_{gd}$) are significant factors affecting performance in this regard. In general, a low gate capacitance is desirable for transistors used in both analog and digital circuits. A low capacitance provides faster switching, higher frequency response and lower current and power requirements.

Although the characteristics of JFETs qualify them as candidates for integration with high speed logic circuits having sophisticated power management requirements, the conventional JFET device structures and processes are not optimized for such integration. The structures and processes that have heretofore been used to produce discrete devices or analog integrated circuits were not designed for integration with CMOS structures and processes.

SUMMARY OF INVENTION

Thus, a need exists for a JFET with minimal parasitic capacitances $C_{gs}$ and $C_{gd}$. There is also a need for method for producing an optimal JFET structure that is compatible with the process flow used for logic integrated circuits. Additionally there is a need for increased flexibility in the control of the lateral doping profile in a gate structure.

Accordingly, embodiments of the present invention include a JFET structure that has reduced $C_{gs}$ and $C_{gd}$ and provides improved performance at high frequencies and greater power efficiency. Another aspect of the invention is a fabrication method that is readily integrated with a conventional process flow for logic integrated circuits. These and other objects and advantages of the present invention and others not specifically recited above will be described in more detail herein.

In an embodiment of the present invention, a gate definition spacer is formed on the wall of an etched trench to establish the lateral extent of an implanted gate region for a JFET. After implant, the gate is annealed. In addition to controlling the final junction geometry and thereby reducing the junction capacitance by establishing the lateral extent of the implanted gate region, the gate definition spacer also limits the available diffusion paths for the implanted dopant species during anneal. The net result is that the interfacial area between the gate and source and gate and drain are reduced, thereby reducing the associated parasitic capacitances $C_{gs}$ and $C_{gd}$.

In another embodiment of the present invention, a gate region is formed by implanting and annealing. After annealing, a portion of the gate structure that is not directly adjacent to the channel is removed, thereby decreasing the parasitic capacitance $C_{gd}$ between the gate and drain.

In a further embodiment of the present invention two ion implant steps are performed over different but overlapping volumes in order to provide an additional degree of flexibility in controlling doping profile of the gate region. By using a "double dose" process comprising a low dose for the first implant over a larger volume followed by a high dose implant over a smaller volume, a graded junction is obtained.

These and other objects and advantages of the present invention will no doubt become obvious to those of ordinary skill in the art after having read the following detailed description of the preferred embodiments which are illustrated in the various drawing figures.

DESCRIPTION OF THE PREFERRED EMBODIMENTS

In the following detailed description of the present invention, a junction field effect transistor (JFET) structure with reduced parasitic capacitances and a method for fabricating the structure; numerous specific details are set forth in order to provide a thorough understanding of the present invention. However, it will be obvious to one skilled in the art that the present invention may be practiced without these specific details. In other instances well known methods involving photolithography, deposition and etch, etc., and well known structures such as ohmic contacts and barrier metallization, etc., have not been described in detail so as not to unnecessarily obscure aspects of the present invention.

U.S. Pat. No. 6,251,716 entitled "JFET Structure and Manufacture Method for Low On-Resistance and Low Voltage Application," issued Jun. 26, 2001, and assigned to the assignee of the present invention, is hereby incorporated herein by reference.

Figure 1A:
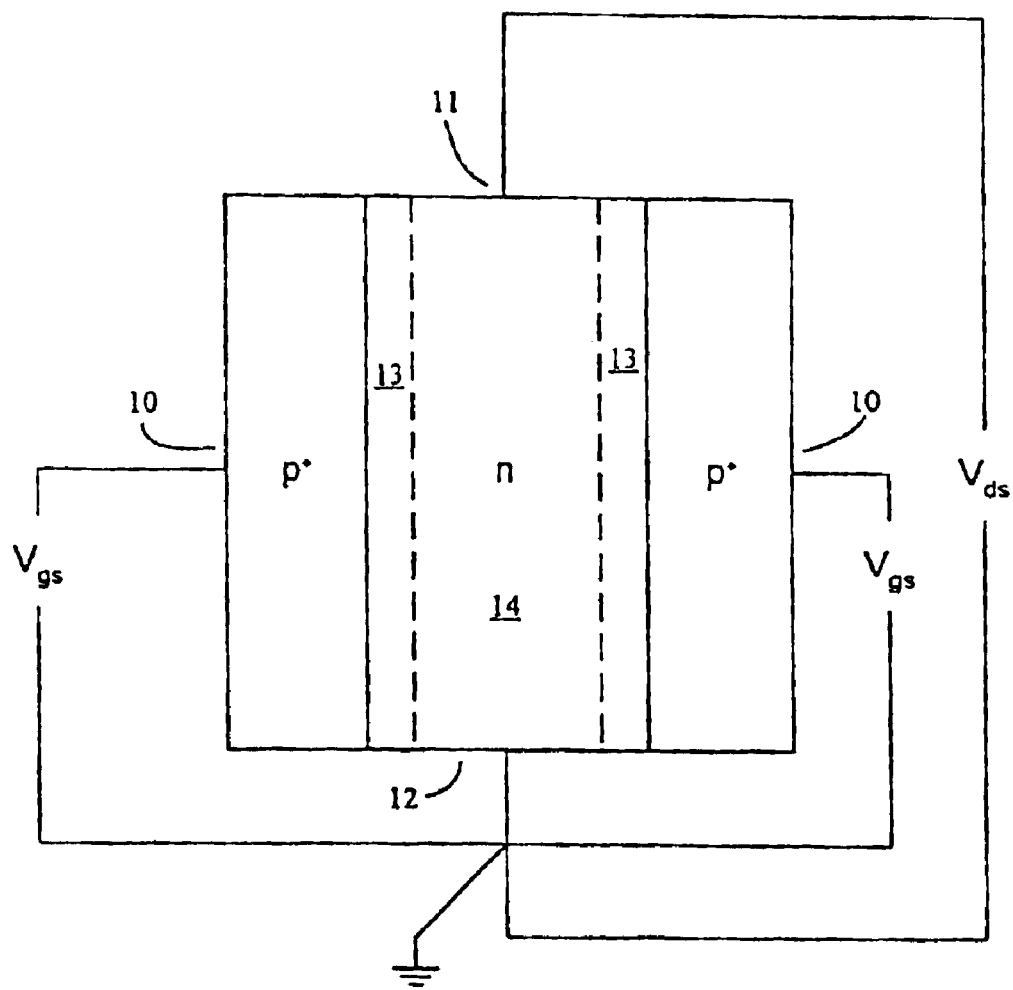
FIG. 1A shows a general schematic for an n-channel depletion mode junction field effect transistor (JFET).

FIG. 1A shows a general schematic for an n-channel depletion mode JFET with $V_{gs}=V_{ds}=0$. The JFET has two opposed gate regions 10, a drain 11 and source 12. The drain 11 and source 12 are located in the n-doped region of the device and the gates 10 are p-doped. Two p-n junctions are present in the device, each having an associated depletion region 13. A conductive channel region 14 is shown between the two depletion regions 13 associated with the p-n junctions. In operation, the voltage variable width of the depletion regions 13 is used to control the effective cross-sectional area the of conductive channel region 14. The application of a voltage $V_{gs}$ between the gates 10 and source 12 will cause the conductive channel region to vary in width, thereby controlling the resistance between the drain 11 and the source 12. A reverse bias, (e.g., a negative $V_{gs}$), will cause the depletion regions to expand, and at a sufficiently negative value cause the conductive channel to "pinch off", thereby turning off the device.

The width of the depletion regions 13 and the conductive channel region 14 are determined by the width of the n-doped region and the dopant levels in the n-doped and p-doped regions. If the device shown in FIG. 1A were constructed with a narrow n-doped region, such that the two depletion regions merged into a single continuous depletion region and the conductive channel region 14 had zero width, the result would be the device shown in FIG. 1B.

Figure 1B:
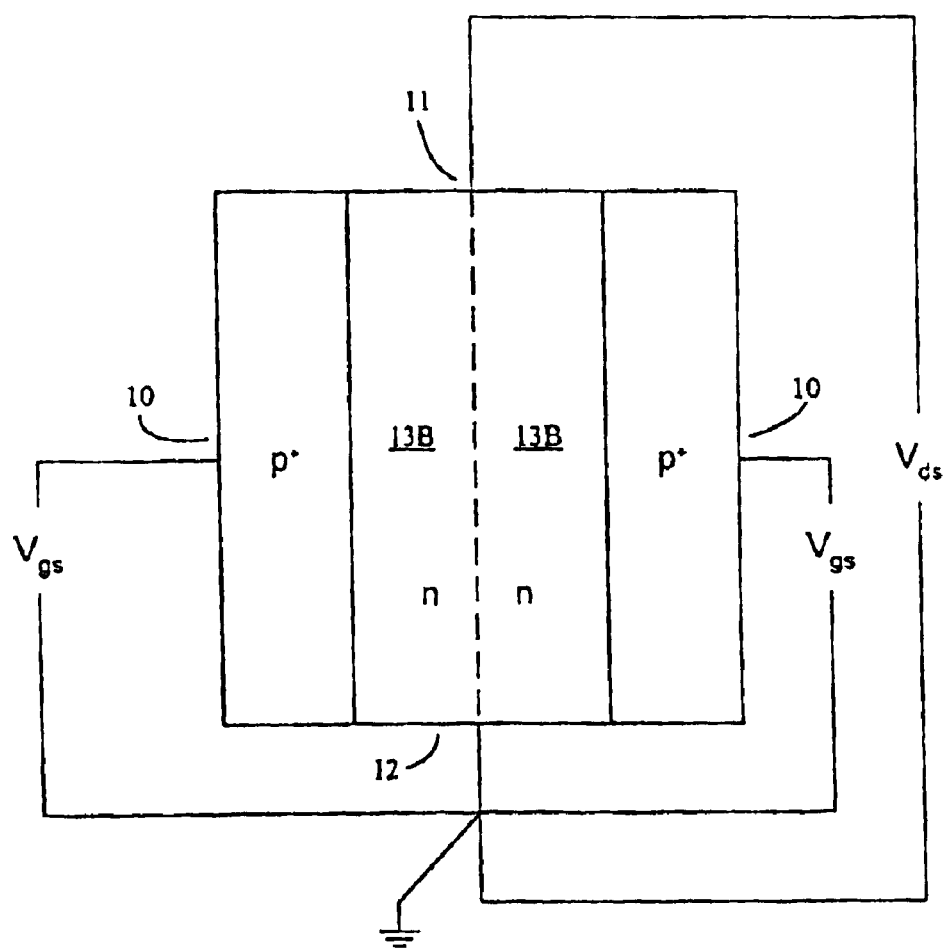
FIG. 1B shows a general schematic for an n-channel enhancement mode junction field effect transistor (JFET).

FIG. 1B shows a general schematic of an n-channel enhancement mode JFET with $V_{gs}=V_{ds}=0$. The enhancement mode device is normally "off" since the conductive channel width is zero due to the extent of the two depletion regions 13B. The application of a sufficient forward bias (e.g. positive $V_{gs}$) to the device of FIG. 1B will cause the depletion regions 13B to contract, thereby opening a conductive channel.

Although the depletion mode and enhancement mode devices shown schematically in FIG. 1A and FIG. 1B are n-channel devices, depletion mode and enhancement mode devices could be constructed with a reversed doping scheme to provide p-channel devices.

Figure 2A:
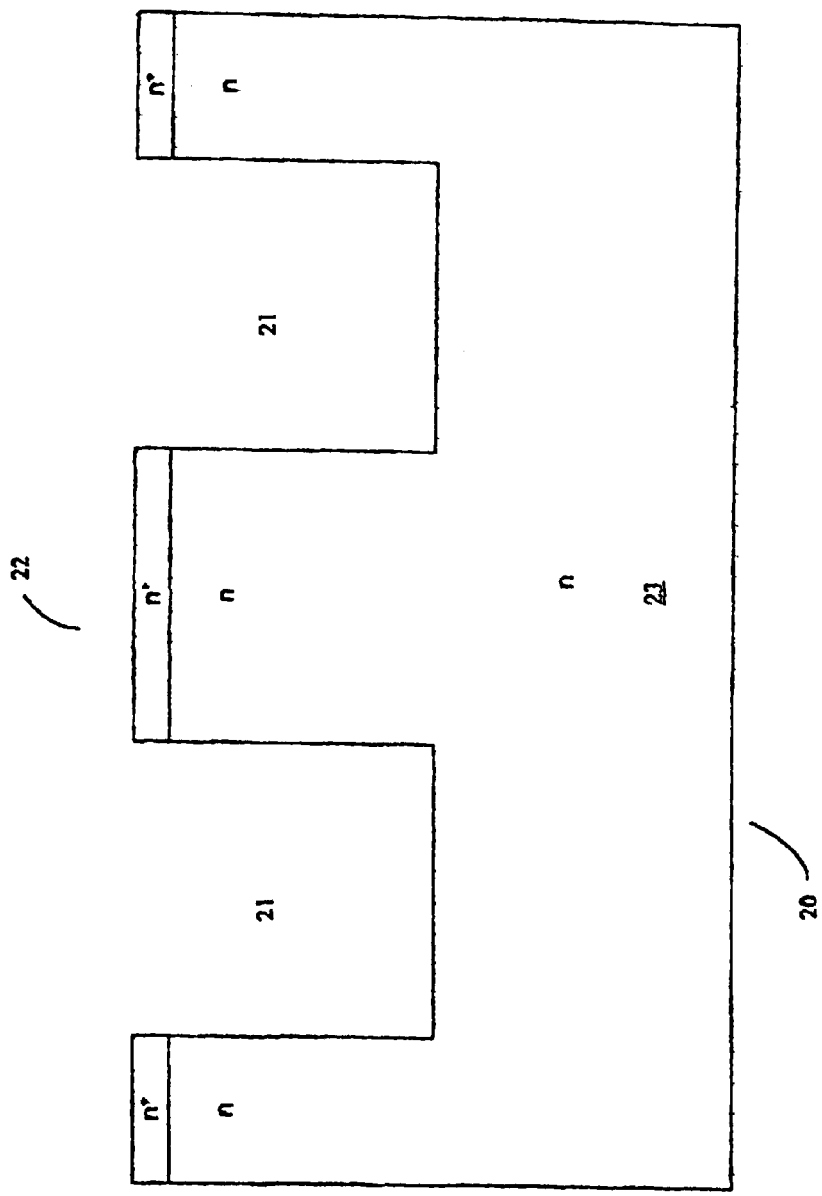
FIG. 2A shows a JFET substrate prior to gate implant.

FIG. 2A shows a cross-section of an n-type semiconductor (e.g., silicon) substrate 20 having etched trench regions 21, a source region 22 having an n⁺-doped contact region, and a drain region 23. The substrate 20 shown may be a semiconducting wafer, an n-type well fabricated on a semiconducting substrate, or an n-type layer deposited on an insulating substrate. The drain contact region is not shown.

Figure 2B:
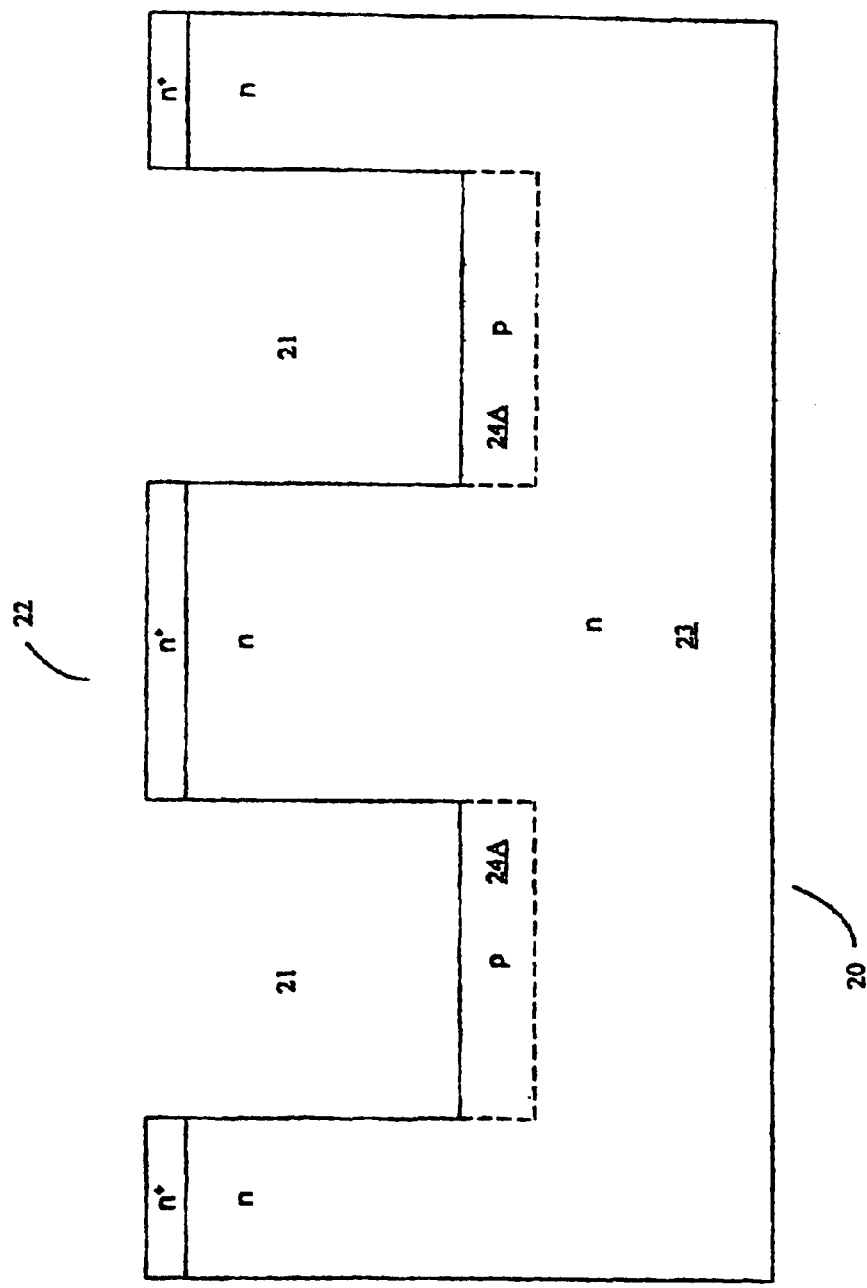
FIG. 2B shows a JFET substrate after gate implant and prior to anneal.

FIG. 2B shows the substrate of FIG. 2A with implanted p-type gate regions 24A. The dashed line in FIG. 2B indicates the initial volume occupied by the implanted dopant species prior to annealing. The lateral boundary of the implanted region is aligned with the trench walls.

Figure 2C:
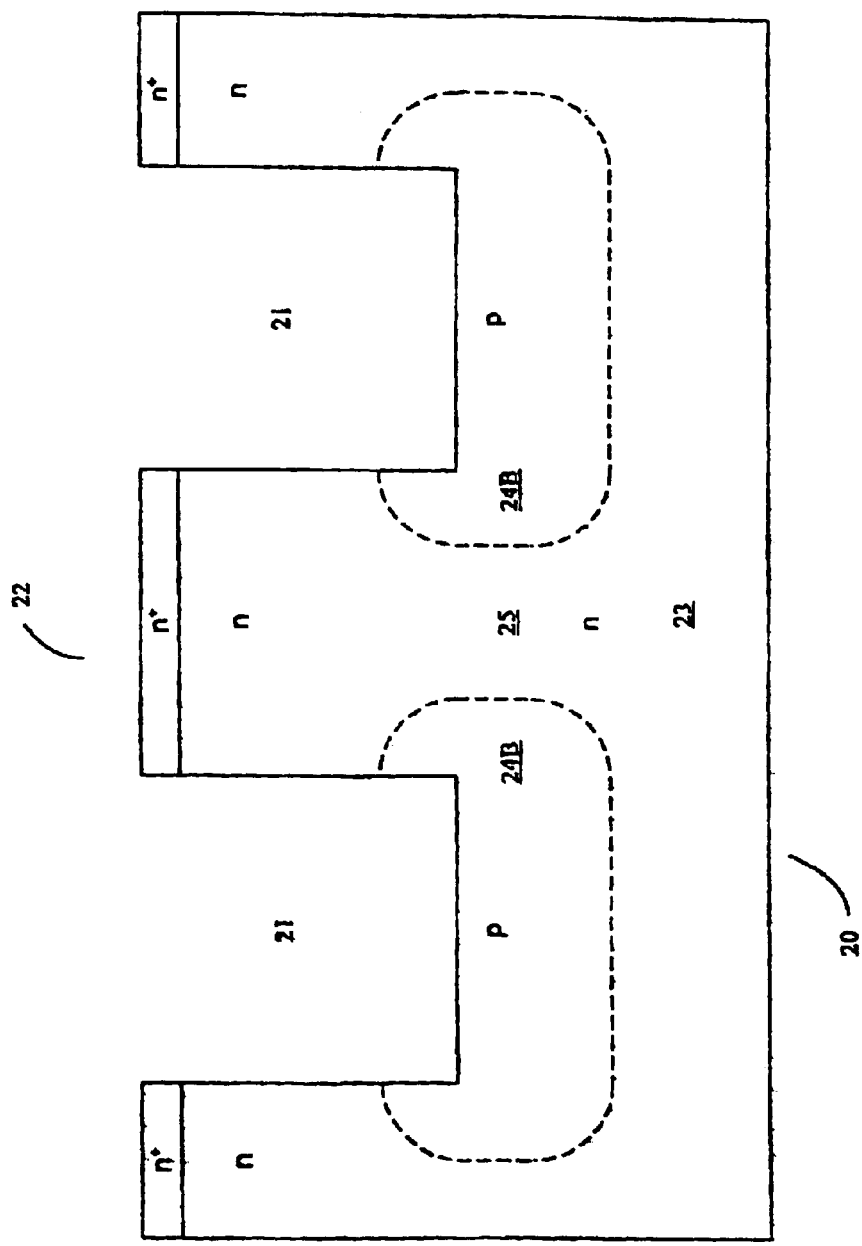
FIG. 2C shows a JFET substrate after anneal.

FIG. 2C shows the structure of FIG. 2B after an annealing process has been applied. The thermal diffusion of the implanted dopant species has enlarged gate regions 24B as shown by the dashed line, in comparison to the gate regions 24A of FIG. 2B. FIG. 2C shows a conventional geometry for the n-type and p-type regions, and the junction interface between the p-type gate regions 24B and the adjacent n-type source 22 and drain 23. A conductive channel region 25 is also shown.

Figure 3A:
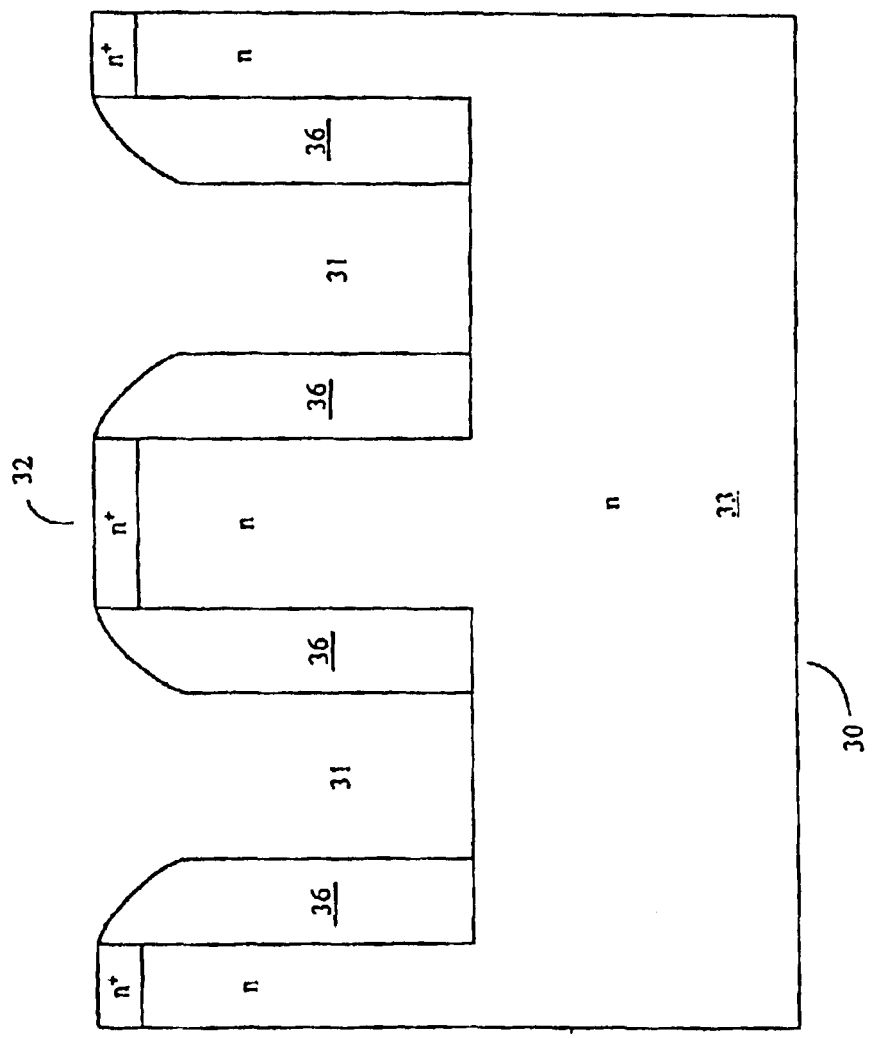
FIG. 3A shows a JFET substrate with a gate definition spacer oxide prior to gate implant in accordance with an embodiment of the present claimed invention.

FIG. 3A shows a cross-section of an n-type semiconductor (e.g. silicon) substrate 30 having etched trench regions 31, a source region 32 having an n⁺-doped contact region, and a drain region 33. The substrate 30 shown may be a semiconducting wafer, an n-type well fabricated on a semiconducting substrate, or an n-type layer deposited on an insulating substrate.

The structure shown FIG. 3A is similar to that of the conventional structure shown in FIG. 2A, however the source region is narrower (e.g. the pitch of the trench regions 31 is smaller), and a gate definition spacer 36 has been deposited on the trench wall in accordance with an embodiment of the present invention. It should be noted that silicon dioxide is the preferred material for the gate definition spacer when used in conjunction with a silicon substrate; however other materials may be used for the gate definition spacer.

Figure 3B:
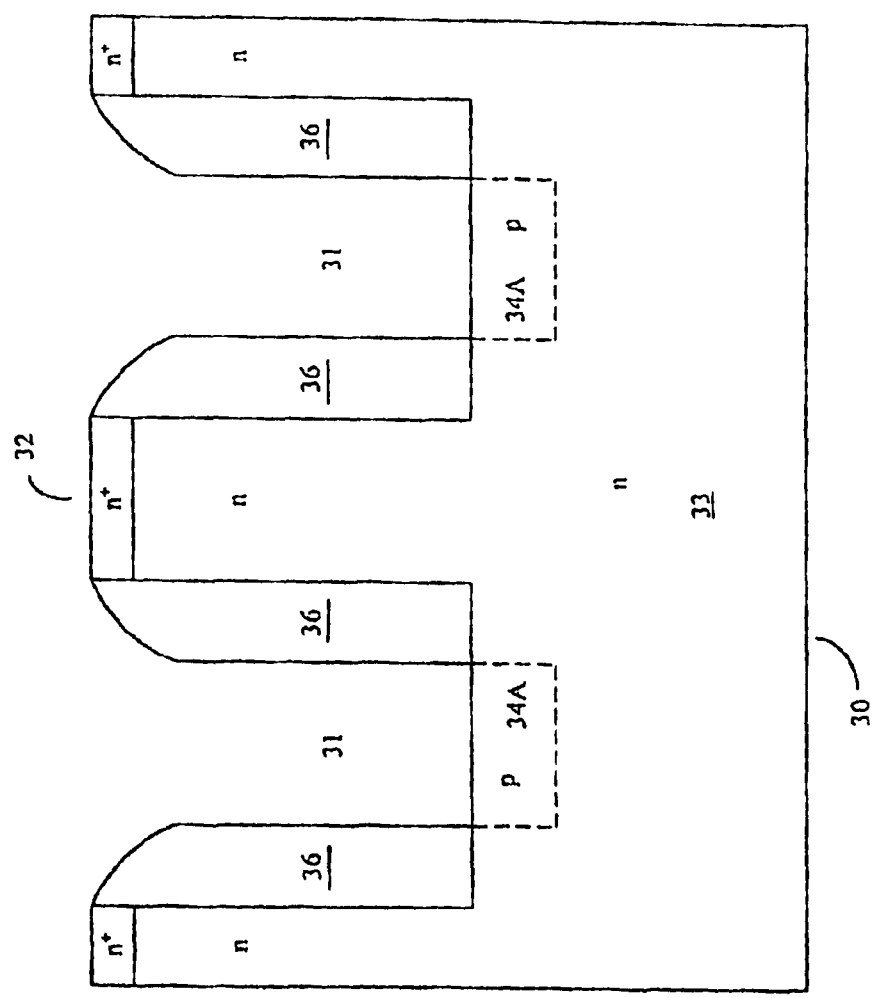
FIG. 3B shows JFET substrate with a gate definition spacer oxide after gate implant and prior to anneal in accordance with an embodiment of the present invention.

FIG. 3B shows the substrate of FIG. 3A with implanted p-type gate regions 34A. The dashed line in FIG. 3B indicates the initial volume occupied by the implanted dopant species prior to annealing. The lateral boundary of the implanted region is aligned with the surface of the gate definition spacer 36 of the present invention. In the present invention, the thickness of the gate definition spacer 36 can be varied to establish the lateral extent of the implanted gate region independent of the actual trench wall surface of the substrate 30. This is distinguished from the conventional approach of FIG. 2B in which the lateral extent of the implanted gate region is aligned with the trench wall surface.

Figure 3C:
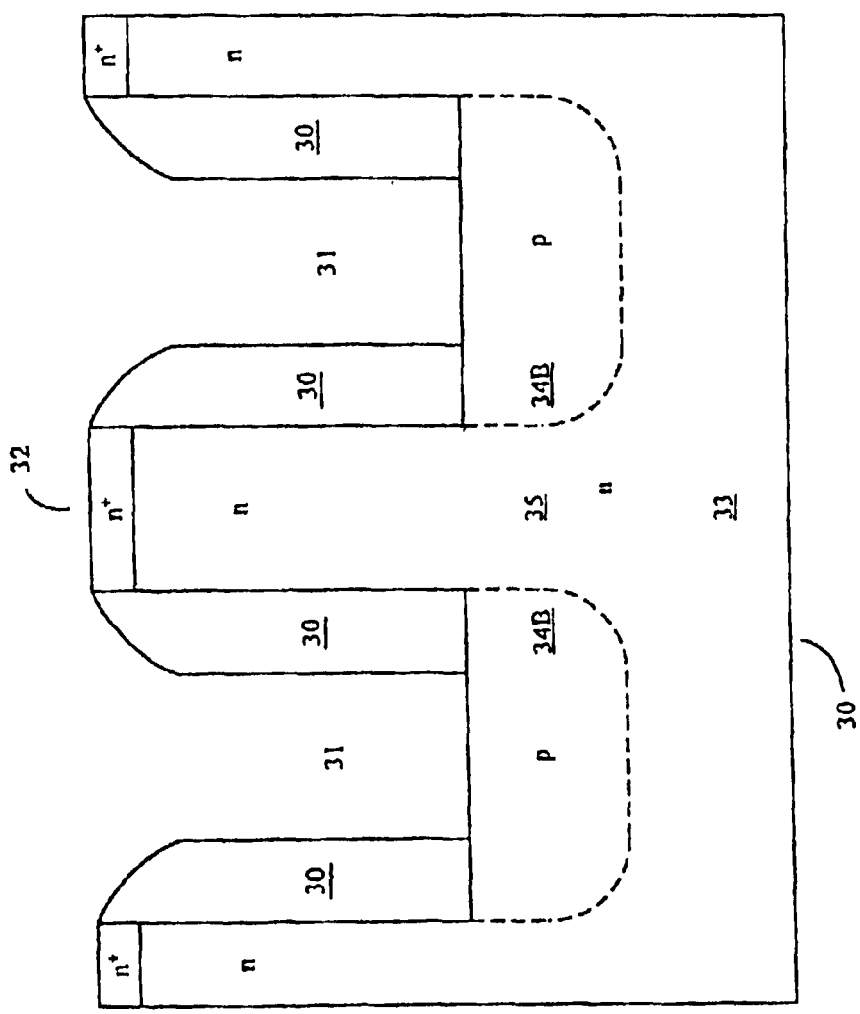
FIG. 3C shows a JFET substrate after anneal in accordance with an embodiment of the present invention.

FIG. 3C shows the structure of FIG. 3B after an annealing process has been applied. The thermal diffusion of the implanted dopant species has enlarged gate regions 34B as shown by the dashed line, in comparison to the gate regions 34A of FIG. 2B. In this particular embodiment of the present invention, the combination of gate definition spacer 36 thickness and trench pitch have been selected to facilitate comparison with the conventional structure shown in FIGS. 2A, 2B and 2C. The anneal and diffusion distance of the implanted species in FIG. 2C and FIG. 3C are essentially the same, and the width of channel 25 in FIG. 2C is essentially the same as the width of channel 35 in FIG. 3C. The presence of the gate definition spacer controls the final junction geometry by establishing the lateral extent of the implanted volume and by limiting the available diffusion paths for the implanted species during anneal.

In comparing the length of channel 25 in FIG. 2C to the length of channel 35 of FIG. 3C, it can be seen that the length of channel 35 is shorter. The shorter channel length improves the frequency response of the device since the carrier transit time is reduced.

Figure 4:
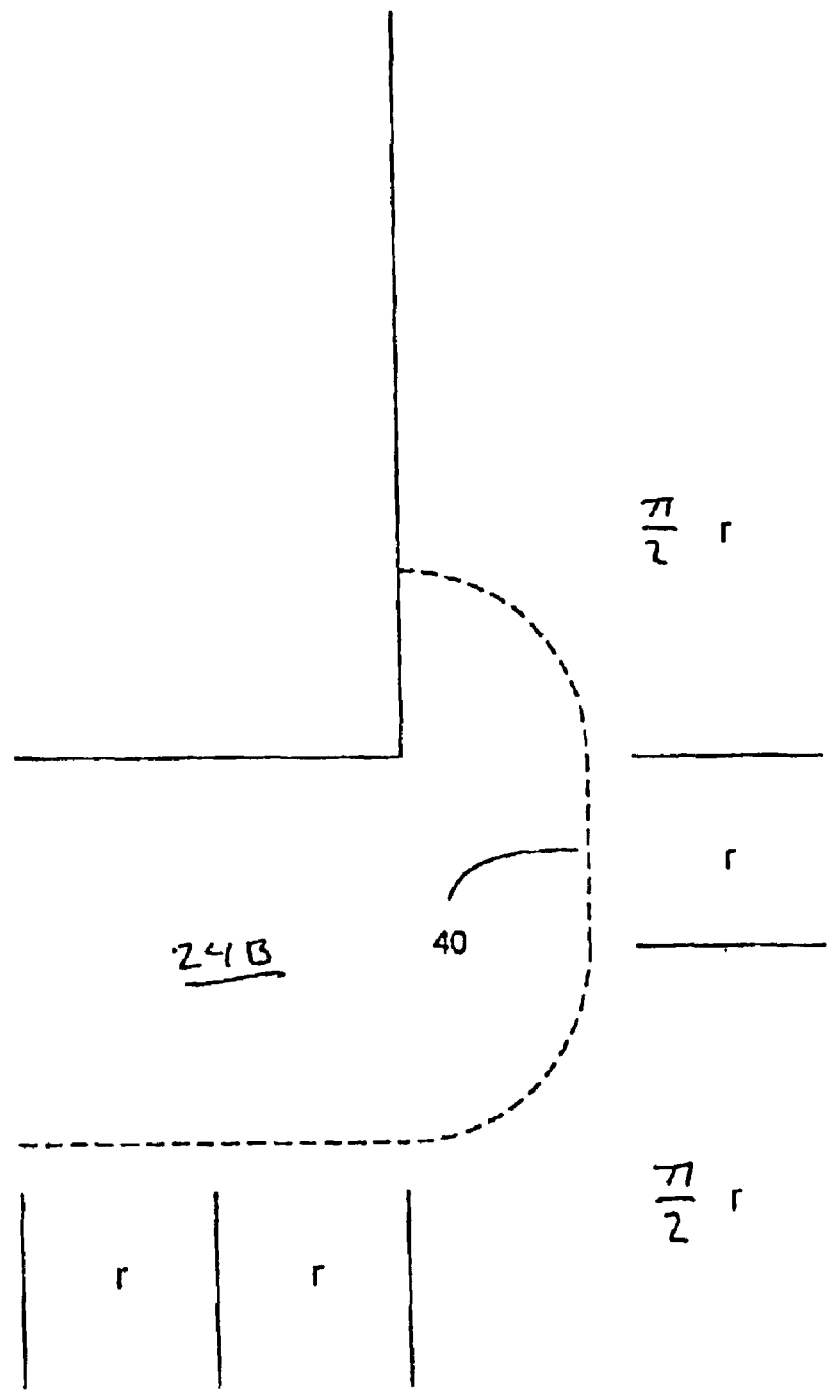
FIG. 4 shows the post-anneal diffusion geometry of FIG. 2C in detail.

FIG. 4 shows the p-n junction interface geometry associated with the conventional structure of FIG. 2C. For purposes of comparison, the interface length can be approximated as the sum of three line segments of length r and two arc segments of length $\pi r/2$. The effective length for the junction interface is thus approximately $(3+\pi)r$, or $6.14r$. In this example, the length r is approximately equal to the diffusion distance associated with the anneal step, which is the same for both FIG. 2C and FIG. 3C.

Figure 5:
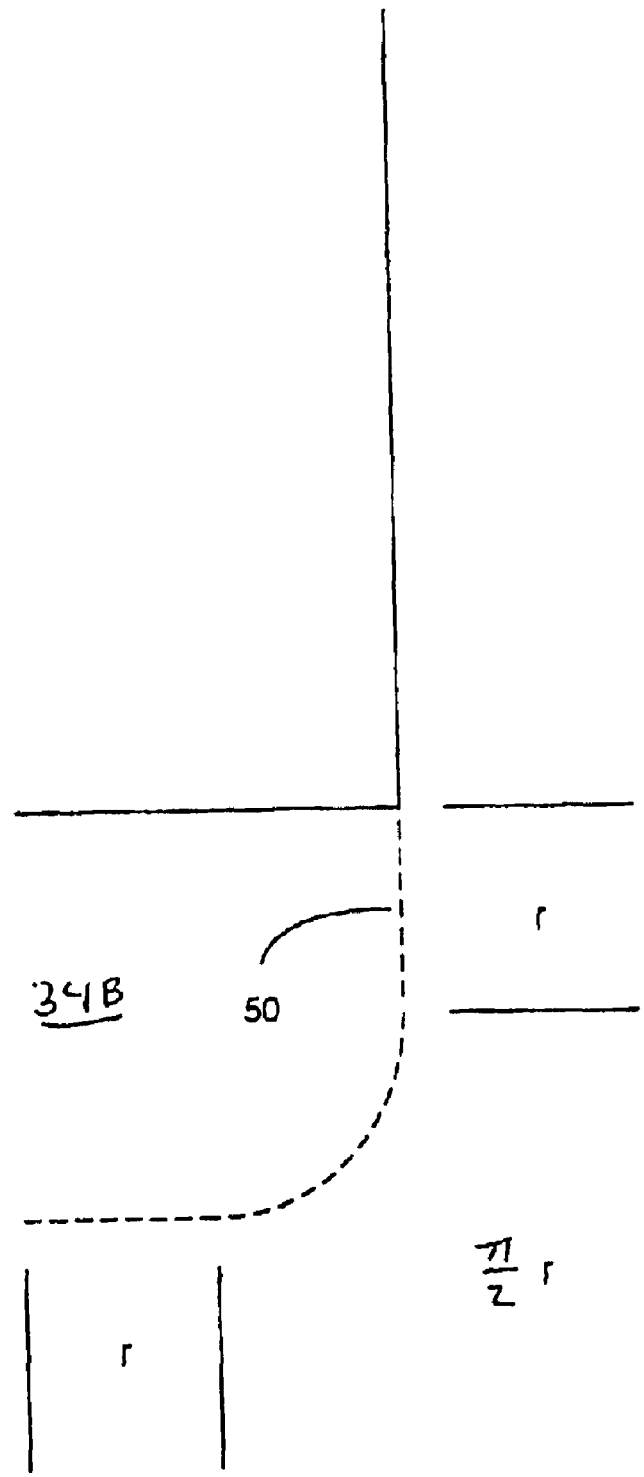
FIG. 5 shows the post-anneal diffusion geometry of FIG. 3C in detail.

FIG. 5 shows the p-n junction interface geometry associated with the structure of FIG. 3C of the present invention. In comparison to FIG. 4, the p-n junction interface length consists of two line segments of length r and one arc segment of length $\pi r/2$, giving an effective length for the junction interface of approximately $(2+\pi/2)r=3.57r$. The effective junction interface length of the present invention is thus about 40% less than that of a conventional structure.

Since the parasitic capacitances $V_{gs}$ and $C_{gd}$ are dependent on the junction interface length, it can be seen that the present invention offers a significant reduction in overall parasitic capacitance in comparison to a conventional structure at a given channel width. The reduction in capacitance attributable to $V_{gs}$ and $V_{gd}$, can be approximated by examining the reduction in interface length on the source side of the channel and the drain side of the channel.

In FIG. 4, the source side length taken from the channel midpoint 40 is $(\pi+1)r/2=2.07r$, whereas in FIG. 5 the source side length taken from the channel midpoint 50 is $r/2=0.5r$. Thus, $C_{gs}$ is reduced by approximately 75%.

In FIG. 4, the drain side length taken from the channel midpoint 40 is $(\pi+5)r/2=4.07r$, whereas in FIG. 5 the source side interface length taken from the channel midpoint 50 is $(\pi+3)r/2=3.07r$. Thus, $C_{gd}$ is reduced by approximately 25%.

Figure 6:
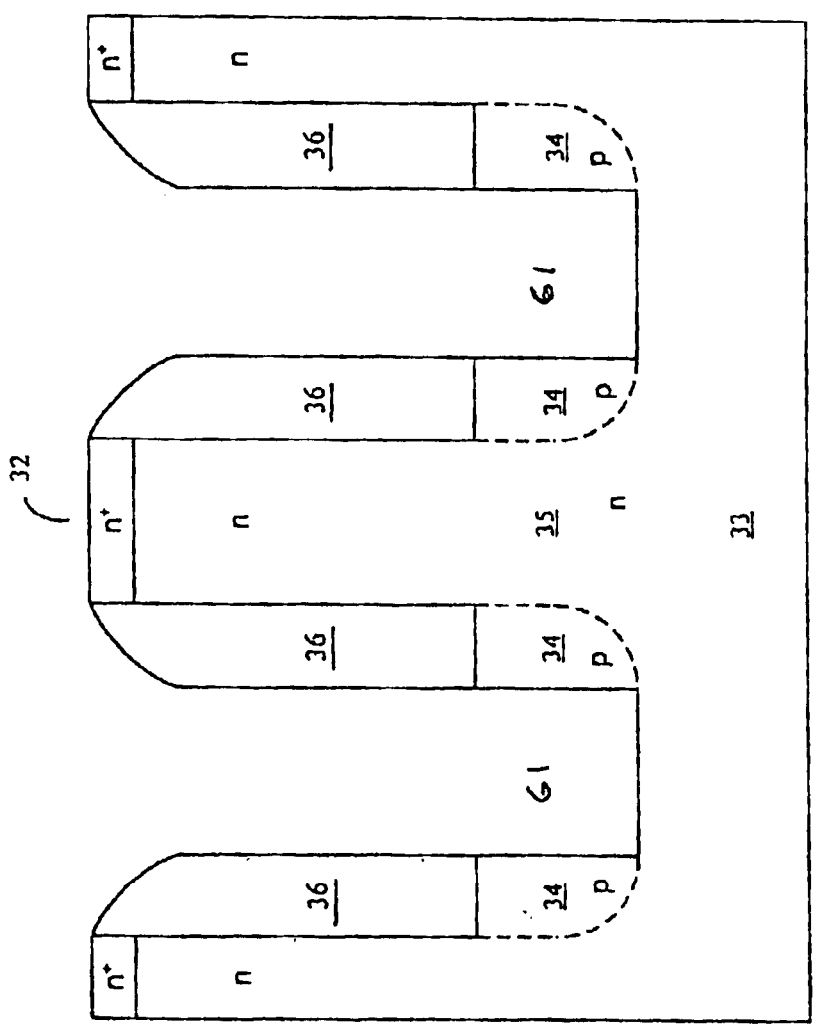
FIG. 6 shows a post anneal gate etch in accordance with an embodiment of the present invention.

FIG. 6 shows another embodiment of the present invention that provides a further reduction in $V_{gd}$. After the annealed structure of FIG. 3C has been fabricated, an additional trench etch is performed to remove a portion of the post-anneal gate region. The walls of this gate surface reduction trench 61 are approximately aligned with the surface of the gate definition spacers 36. In comparison with the conventional structure of FIG. 4, a reduction from $4.07r$ to $2.07r$ is obtained in the drain side interface length from channel midpoint 40. This amounts to an approximate 50% reduction in $C_{gd}$. The gate surface reduction trench 62 as shown has the minimum depth required to achieve a reduction in $C_{gd}$ (e.g. a portion of the p-n junction has been removed and the depletion region removed with it). A further reduction in fringing capacitance can be achieved by increasing the depth of the second trench 62 beyond that shown in FIG. 6.

Figure 7:
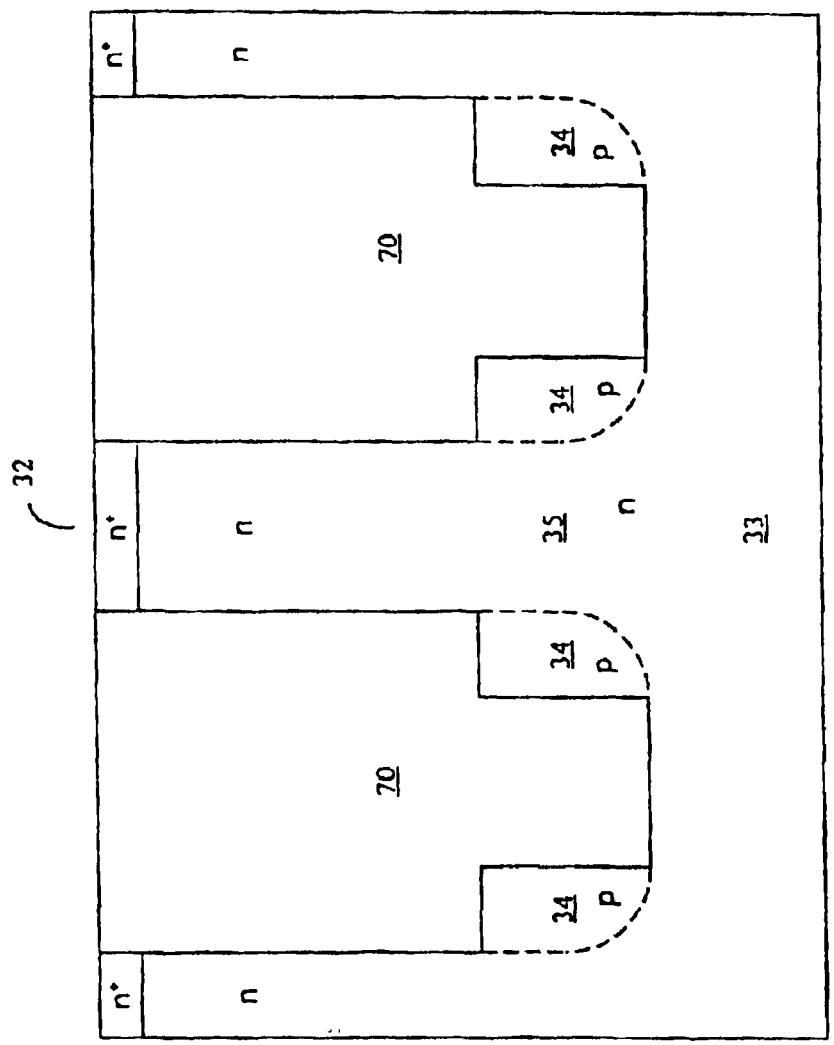
FIG. 7 shows the structure of FIG. 6 with an oxide backfill in accordance with an embodiment of the present invention.

FIG. 7 shows the structure of FIG. 6 with an oxide backfill 70. Backfill of the trenches provides a surface that is available for contact metallization. Alternatively, contacts to the gate regions 34 may be established in portions of the trench.

Figure 8:
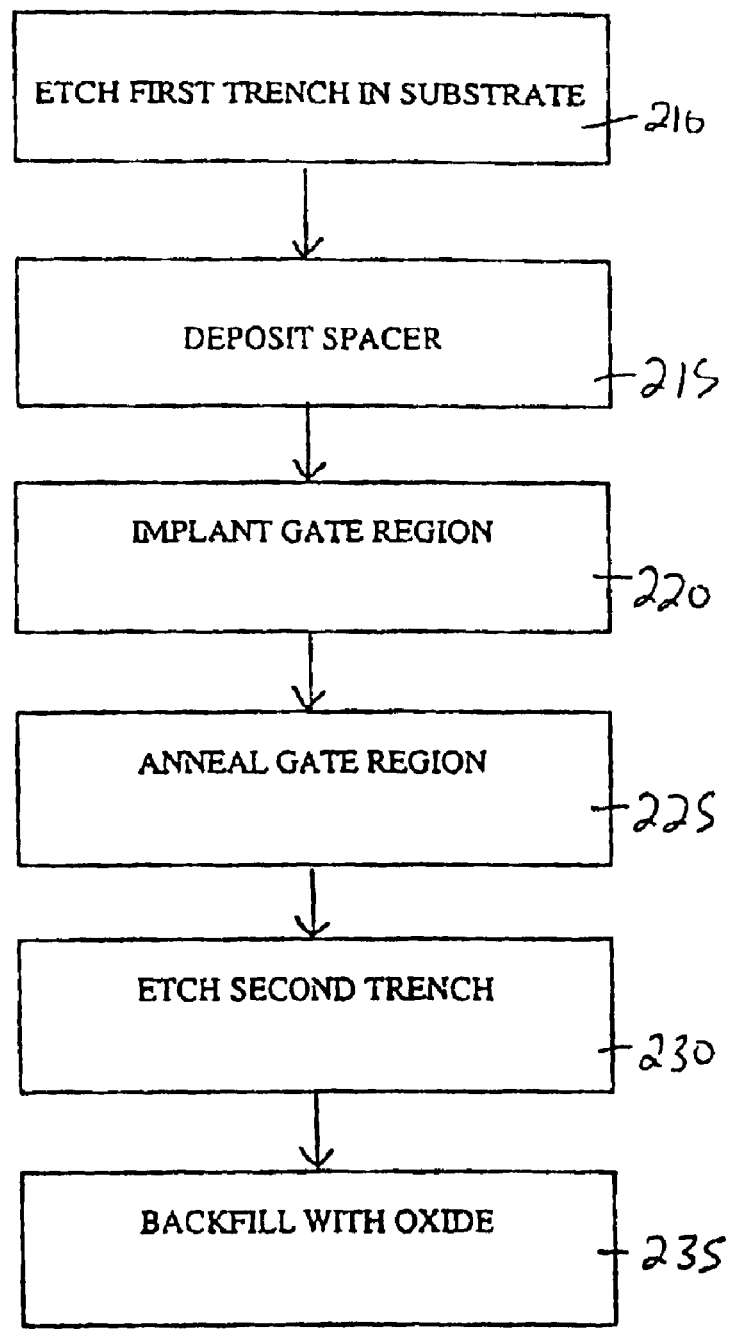
FIG. 8 shows a flow chart for a method embodiment of the present invention.

FIG. 8 shows an overall process flow 200 in accordance with the present invention. In the first step 210 a trench is etched in a semiconductor substrate. In the second step 215 a gate definition spacer is deposited on the walls of the trench etched in the first step. In the third step 220 a gate region is implanted. In the fourth step 225 the gate region is annealed. In the fifth step 230 a second trench is etched to remove a portion of the gate volume. In the sixth step 235 the trench is backfilled with oxide.

Figure 9:
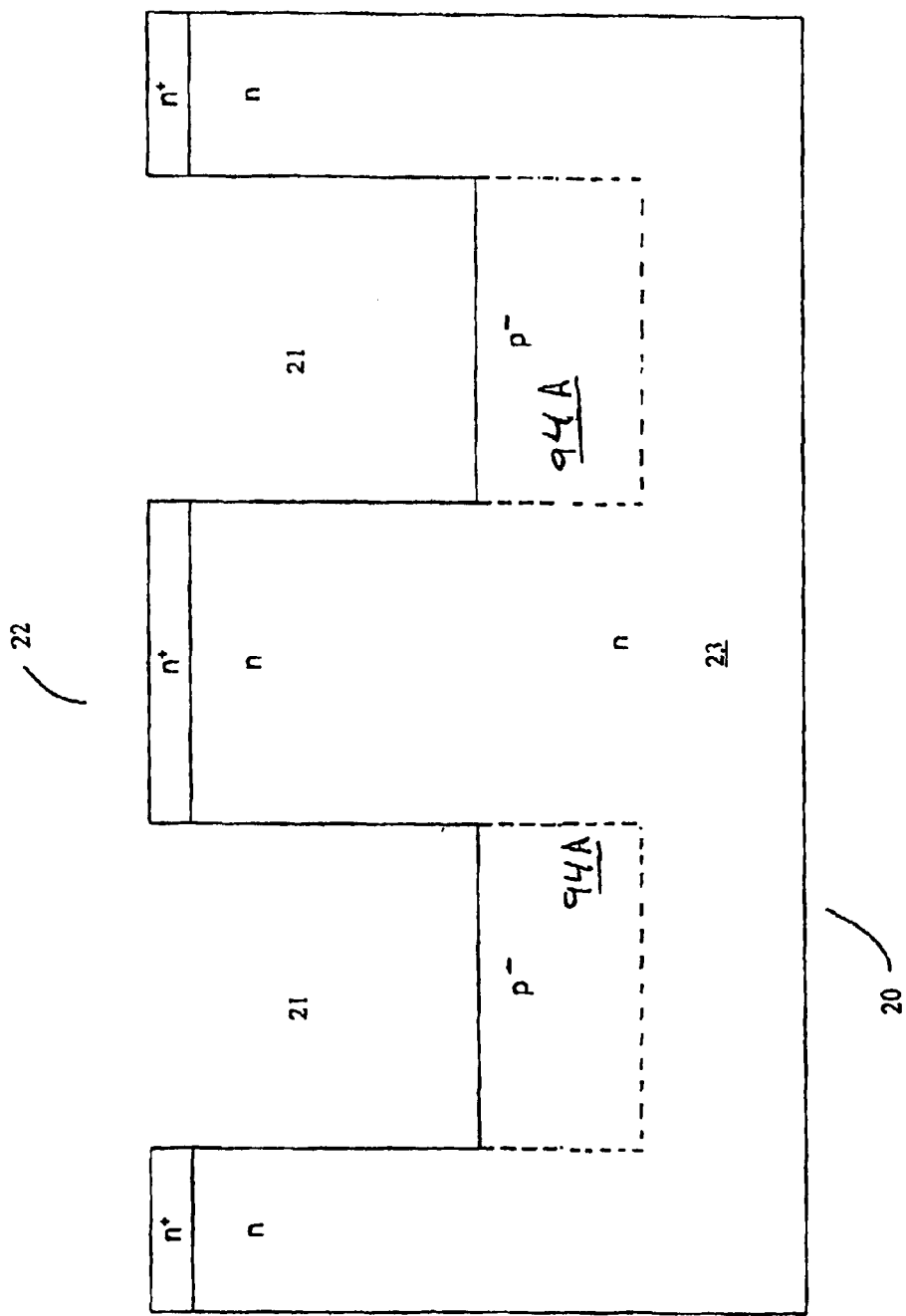
FIG. 9 shows a low dose gate implant prior to the formation of a gate definition spacer in accordance with the present claimed invention.

FIG. 9 shows a structure similar to that shown in FIG. 2B; however, instead of a conventional p-doped region 24A as shown in FIG. 2B, a lightly doped p⁻ implant region 94A has been added. The lightly doped region 94A may or may not be annealed prior to the second implant following the deposition of agate definition spacer.

Figure 10:
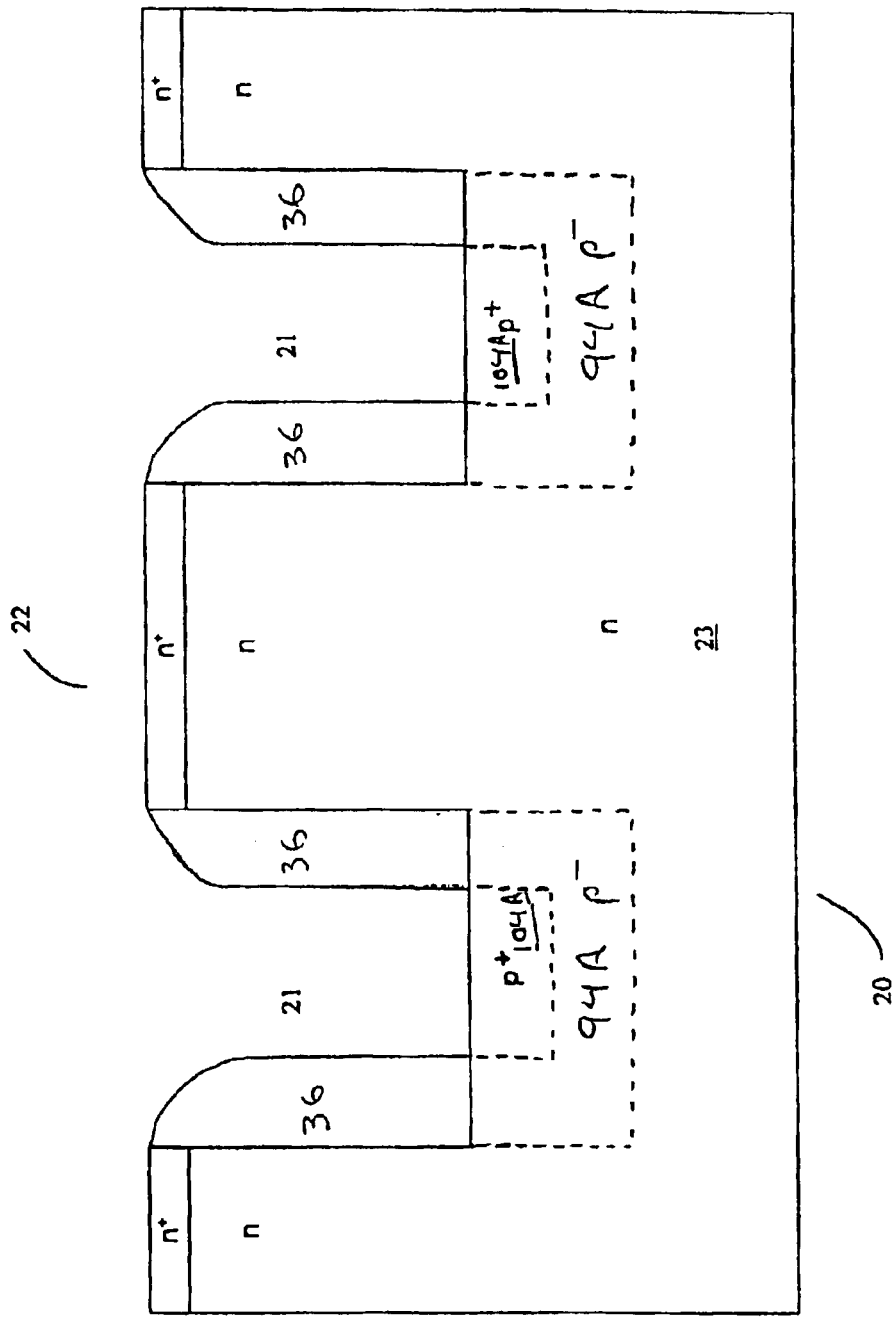
FIG. 10 shows a high dose gate implant after the formation of a gate definition spacer in accordance with the present claimed invention.

FIG. 10 shows the structure of FIG. 9 with the addition of a gate definition spacer 36, and a heavily doped p⁺ implant region 104A to produce the double dose gate structure of the present invention, e.g., the superposition of two different and overlapping regions provides an additional degree of flexibility in determining the ultimate gate region doping profile. It should be noted that due to the additive effect of the two implants in the overlap region, the volumetric contribution (e.g. number of ions per unit volume) of implant species of the second implant does not necessarily need to be higher than that of the first implant.

Figure 11:
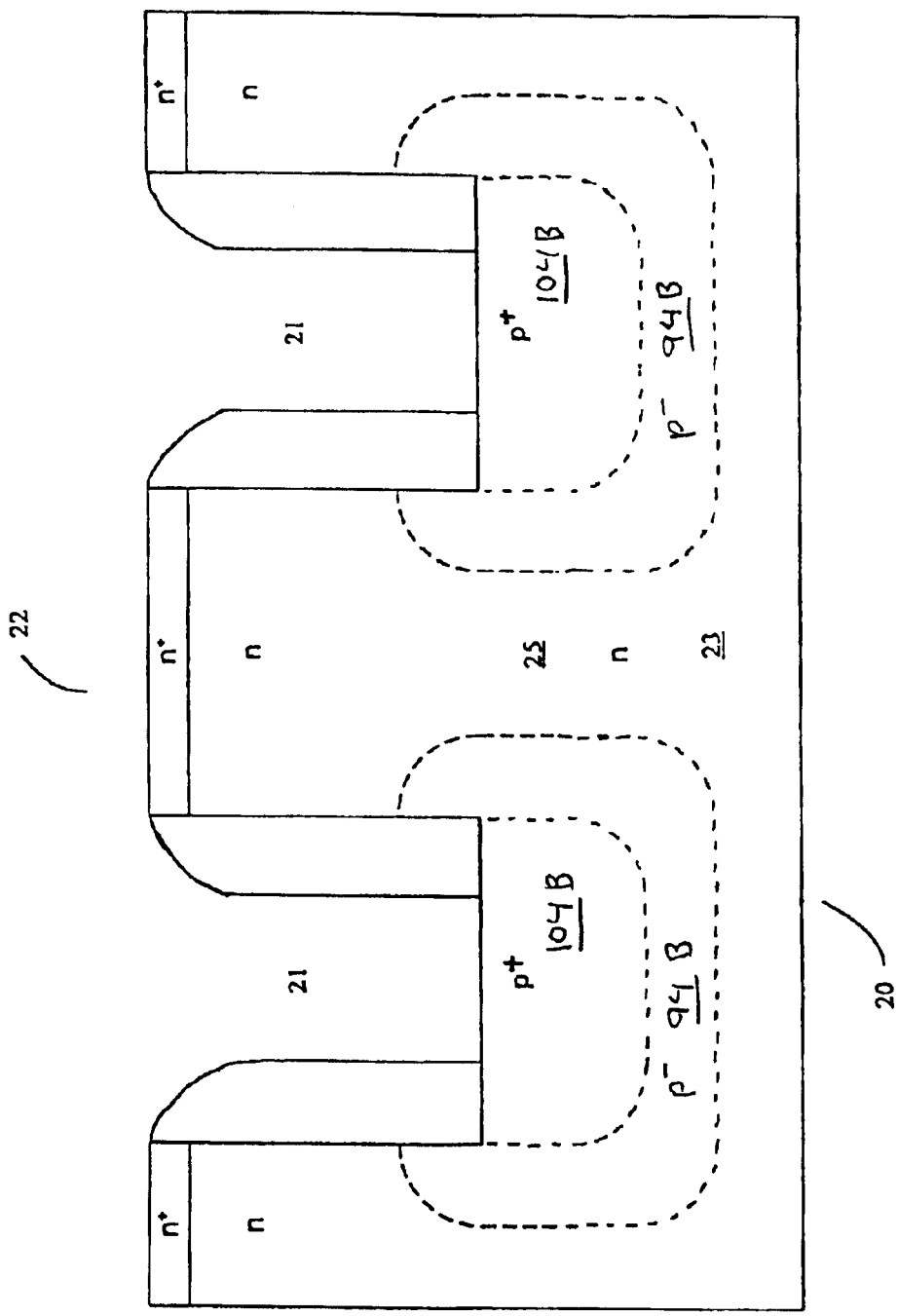
FIG. 11 shows the combination of the gate implants of FIG. 9 and FIG. 10 after annealing.

FIG. 11 shows the structure of FIG. 10 after an annealing step has been performed. As shown, the dashed lines approximate the diffused extent of the original implanted regions with a single anneal after the second implant. An additional degree of flexibility is provided by the option to anneal after the first implant and prior to the second implant. The use of the gate definition spacer combined with the adjustment of accelerating potential of the implanted species combine to provide three-dimensional control over the doping profile of the implanted gate region. Typically, the second implant will be shallower than the first implant, but not necessarily so.

Figure 12:
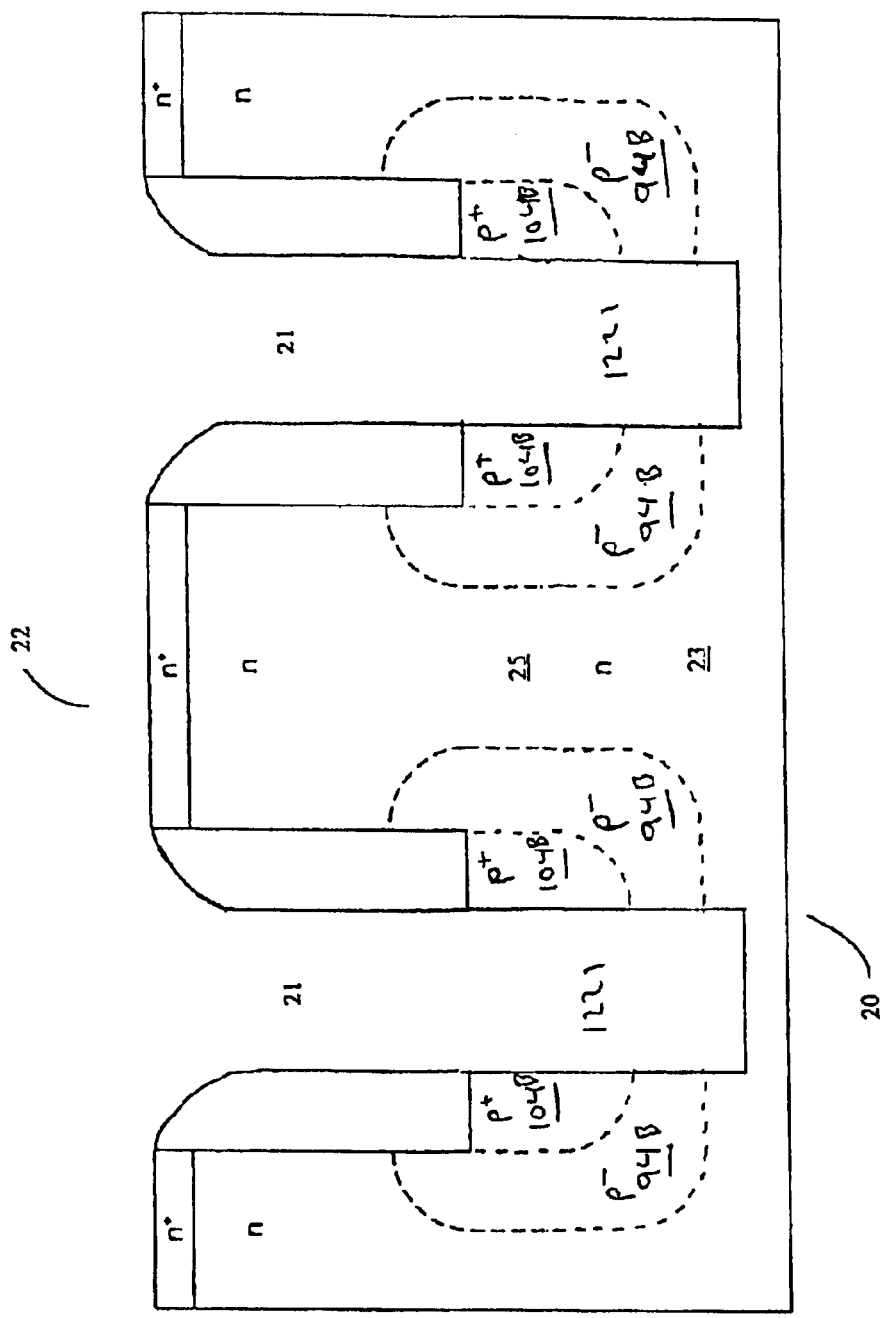
FIG. 12 shows the structure of FIG. 11 in combination with a gate surface reduction trench.

FIG. 12 shows the structure of FIG. 11 with the additional step of etching a gate surface reduction trench 1221 similar to that of FIG. 7, but extending deeper into the substrate. Subsequent to the etching of the gate surface reduction trench 1221, gate contacts may be deposited and/or an oxide backfill performed similar to that shown in FIG. 7.

Figure 13:
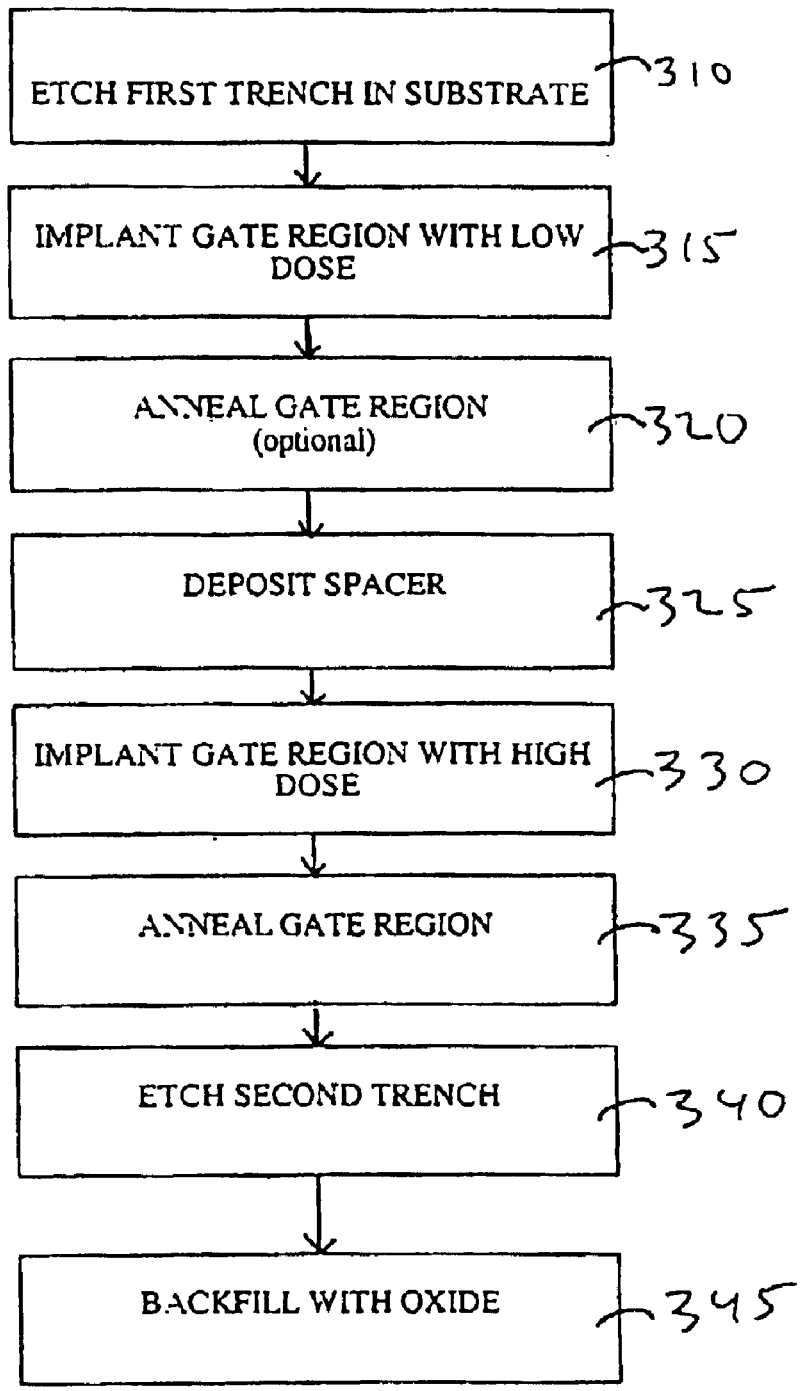
FIG. 13 shows flow chart for a two-step gate implant process embodiment in accordance with the present claimed invention.

FIG. 13 shows an overall process flow 300 in accordance with the present claimed invention. In the first step 310 a trench is etched in a semiconductor substrate. In the second step 315 a lightly doped gate region is formed by a first ion implant using a low dose. In the third step 320 an optional anneal of the first ion implanted region may be performed. In the fourth step 325 a gate definition spacer is deposited on the wall of the trench etched in the first step. In the fifth step 330 a heavily doped gate region is formed using a high dose. In the sixth step 335 the gate region is annealed. In the seventh step 340 a second trench is etched to remove a portion of the gate volume. In the eighth step 345 the trench is backfilled with oxide.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the Claims appended hereto and their equivalents.

What is claimed is:

1. A JFET having a gate definition spacer and a double dose gate structure.

2. The JFET of claim 1 wherein said JFET is an n-channel JFET.

3. The JFET of claim 2 wherein said JFET is an enhancement mode JFET.

4. The JFET of claim 2 wherein said JFET is a depletion mode JFET.

5. The JFET of claim 1 wherein said JFET is a p-channel JFET.

6. The JFET of claim 5 wherein said JFET is an enhancement mode JFET.

7. The JFET of claim 5 wherein said JFET is a depletion mode JFET.

8. A JFET having a gate definition spacer, a double dose gate structure, and a gate surface reduction trench.

9. The JFET of claim 8 wherein said JFET is an n-channel JFET.

10. The JFET of claim 9 wherein said JFET is an enhancement mode JFET.

11. The JFET of claim 9 wherein said JFET is a depletion mode JFET.

12. The JFET of claim 8 wherein said JFET is a p-channel JFET.

13. The JFET of claim 12 wherein said JFET is an enhancement mode JFET.

14. The JFET of claim 12 wherein said JFET is a depletion mode JFET.

15. A transistor structured comprising:

a) a semiconducting substrate further comprising a drain region and a source region;

b) at least one gate region forming a p-n junction with each of said source region and said drain region;

c) a double dose gate structure;

d) a gate definition spacer; and, e) a gate surface reduction trench.

16. A transistor structure of claim 15 wherein said semiconducting substrate is an n-type substrate.

17. A transistor structure of claim 16 wherein said structure includes two gate regions having merged depletion regions.

18. A transistor structure of claim 16 wherein said structure includes two gate regions, wherein each of said gate region has an associated depletion region, and wherein said depletion regions are separated by a conductive channel.

19. A transistor structure of claim 15 wherein said semiconducting substrate is an p-type substrate.

20. A transistor structure of claim 19 wherein said structure includes two gate regions having merged depletion regions.

21. A transistor structure of claim 19 wherein said structure includes two gate regions, wherein each of said gate region has an associated depletion region, and wherein said depletion regions are separated by a conductive channel.

* * * * *